United States Patent
Nagai

(10) Patent No.: US 8,771,030 B2
(45) Date of Patent: Jul. 8, 2014

(54) COLOR CONVERSION LAYER AND MANUFACTURING METHOD FOR SAME

(75) Inventor: Masaru Nagai, Nagano (JP)

(73) Assignee: Sharp Kabushiki Kaisha (JP)

(*) Notice: Subject to any disclaimer, the term of this patent is extended or adjusted under 35 U.S.C. 154(b) by 369 days.

(21) Appl. No.: 12/992,078

(22) PCT Filed: Aug. 19, 2009

(86) PCT No.: PCT/JP2009/064512
§ 371 (c)(1),
(2), (4) Date: May 9, 2012

(87) PCT Pub. No.: WO2011/021286
PCT Pub. Date: Feb. 24, 2011

(65) Prior Publication Data
US 2012/0217867 A1    Aug. 30, 2012

(51) Int. Cl.
*H01J 9/24*    (2006.01)
*G02B 5/20*    (2006.01)
(52) U.S. Cl.
CPC ..................... *G02B 5/201* (2013.01)
USPC .......................................................... 445/24
(58) Field of Classification Search
CPC ..................................................... G02B 5/201
USPC ............................................................. 445/24
See application file for complete search history.

(56) References Cited

U.S. PATENT DOCUMENTS 5,683,823 A    11/1997  Shi et al.
7,300,709 B2 *  11/2007  Owczarczyk et al. ........ 428/690

FOREIGN PATENT DOCUMENTS

| JP | 03-230584 A | 10/1991 |
| JP | 07-142169 A | 6/1995 |
| JP | 2000-230172 A | 8/2000 |
| JP | 2000-243563 A | 9/2000 |
| JP | 2002-075643 A | 3/2002 |
| JP | 2003-217859 A | 7/2003 |
| JP | 2003-277743 A | 10/2003 |
| JP | 2003-277744 A | 10/2003 |
| JP | 2003-306454 A | 10/2003 |
| JP | 2004-362910 A | 12/2004 |
| JP | 2006-100134 A | 4/2006 |
| JP | 2006-228581 A | 8/2006 |

OTHER PUBLICATIONS

International Search Report issued in corresponding PCT/JP2009/064512, dated Nov. 6, 2009.

* cited by examiner

*Primary Examiner* — Anh Mai
*Assistant Examiner* — Hana Featherly
(74) *Attorney, Agent, or Firm* — Rossi, Kimms & McDowell LLP

(57) ABSTRACT

This invention provides a method capable of fabricating, by simple manufacturing processes, a color conversion layer which realizes high-efficiency color conversion characteristics without greatly increasing the film thickness of the color conversion layer. Further, this invention provides a color conversion layer manufactured by this method, and an organic EL element which includes this color conversion layer. By means of a method in which a polymer material having a weight-average molecular weight in a specific range is brought into contact with a color conversion material layer, and the polymer material is caused to intrude into the color conversion layer by a diffusion phenomenon, concentration quenching in the color conversion layer can be suppressed, and the fluorescence quantum yield can be increased.

9 Claims, 3 Drawing Sheets

Diffusion Polymer Material Layer — 0.733 μm

Color Conversion Layer — 1.645 μm

Conventional Color Conversion Layer — 0.790 μm

COLOR CONVERSION LAYER AND MANUFACTURING METHOD FOR SAME

This application is a U.S. National Phase Application of PCT International Application PCT/JP2009/064512 filed on Aug. 19, 2009, the contents of which are incorporated herein by reference in their entirety.

TECHNICAL FIELD

This invention relates to a color conversion layer and a manufacturing method for the same, as well as to an organic EL element using such a color conversion layer. More specifically, this invention relates to a method of suppressing concentration quenching in a color conversion layer, and improving the emission efficiency and luminous efficiency of an organic EL element using such a color conversion layer.

BACKGROUND ART

In recent years vigorous research has been performed aiming at commercialization of organic EL elements. Because high current densities can be realized at low voltages, it is anticipated that organic EL elements will achieve high emission luminance and emission efficiency. In particular, it is anticipated that high-definition multicolor organic EL displays capable of multicolor or full-color display will be commercialized.

One example of a method of realizing multicolor or full-color display in an organic EL display uses a plurality of types of color filters which transmit light in specific wavelength regions (color filter method). When employing a color filter method, it is necessary that the organic EL element emit, as the multicolor light, so-called "white light" including an appropriate balance of light in the three primary colors (red (R), green (G), blue (B)).

In order to obtain a multicolor-emission organic EL element, Japanese Patent Application Laid-open No. H3-230584 and Japanese Patent Application Laid-open No. 2000-243563 propose methods of using a plurality of emission layers including different types of emission dyes to simultaneously excite a plurality of emission dyes (see Patent References 1 and 2). And, U.S. Pat. No. 5,683,823 proposes a method of using an emission layer containing a host emission material and a guest emission material, and causing excitation of and emission by the host emission material, while simultaneously causing movement of energy to and emission by the guest material (see Patent Reference 3).

However, multicolor-emission organic EL elements rely on either simultaneous excitation of a plurality of types of emission materials, or on energy movement between a plurality of types of emission materials. It has been reported that in such elements, the balance of emission intensities among emission materials changes accompanying the passage of driving time or changes in the current passed, and there are concerns that the hue obtained may change.

As other methods of obtaining multicolor-emission organic EL elements, Japanese Patent Application Laid-open No. 2002-75643 and Japanese Patent Application Laid-open No. 2003-217859 propose color conversion methods which use single-color emission organic EL elements and color conversion layers (see Patent References 4 and 5). Color conversion layers used in these proposals are layers containing one or a plurality of color conversion materials, which absorb short-wavelength light and perform conversion into long-wavelength light.

However, if a color conversion layer is formed using a single color conversion material, a phenomenon called concentration quenching occurs. "Concentration quenching" means that energy absorbed by a color conversion material, during repeated movement between molecules, is dissipated without resulting in emission. In order to suppress this phenomenon, Japanese Patent Application Laid-open No. 2000-230172 proposes a media-disperse type color conversion layer, in which color conversion material is dissolved or dispersed in some media to lower the concentration (see Patent Reference 6). In a media-disperse type color conversion layer, as the concentration of the color conversion material is lowered, interaction between color conversion materials can be suppressed.

Here, if the concentration of the color conversion materials is lowered, the absorbance for the light to be absorbed is lowered, and so adequate converted light intensity cannot be obtained. In response to this problem, the film thickness of the color conversion layer is increased to raise the absorbance and maintain color conversion efficiency. When using such a thick color conversion layer (of film thickness approximately 10 μm), problems such as large steps, difficulty in achieving high definition, and residual water or solvent in the film, occur. When large steps exist, if an EL element is to be formed on a color conversion layer, breaks in electrode patterns occur at step portions. Further, when there is residual water or solvent in the film, upon combination with an organic EL element, the residual water or solvent causes degradation of the organic EL layer, and display defects are caused as a result.

Patent Reference 1: Japanese Patent Application Laid-open No. H3-230584
Patent Reference 2: Japanese Patent Application Laid-open No. 2000-243563
Patent Reference 3: U.S. Pat. No. 5,683,823
Patent Reference 4: Japanese Patent Application Laid-open No. 2002-75643
Patent Reference 5: Japanese Patent Application Laid-open No. 2003-217859
Patent Reference 6: Japanese Patent Application Laid-open No. 2000-230172
Patent Reference 7: Japanese Patent Application Laid-open No. H7-142169
Patent Reference 8: Japanese Patent Application Laid-open No. 2003-277743
Patent Reference 9: Japanese Patent Application Laid-open No. 2003-277744
Patent Reference 10: Japanese Patent Application Laid-open No. 2003-306454

Hence in order to realize a color conversion layer capable of maintaining adequate converted light intensity over a long period, technology to suppress concentration quenching without greatly increasing the film thickness of the color conversion layer is desired.

Further, in order to fabricate such a color conversion layer at low cost, use of an application process after dissolving the color conversion material in an appropriate solvent is desired.

DISCLOSURE OF THE INVENTION

An object of this invention is to provide a color conversion layer capable of maintaining adequate converted light intensity over a long period, without greatly increasing the film thickness. A further object of this invention is to provide a color conversion layer which can be fabricated by a low-cost wet process.

Still a further object of this invention is to provide a multicolor-emission organic EL element using such a color conversion layer.

In order to suppress concentration quenching in a color conversion layer, it is necessary to reduce interactions between molecules of color conversion materials. However, as explained above, numerous problems attend methods in which contact is suppressed between color conversion materials which are dissolved or dispersed in media.

As a result of diligent research, the inventors discovered a method in which, rather than dissolving or dispersing color conversion materials, a polymer material having a weight-average molecular weight in a specific range is brought into contact with the color conversion material layer, and the polymer material is caused to intrude into the color conversion layer by a diffusion phenomenon. By this method, the above-described problems can be eliminated while effectively suppressing concentration quenching in the color conversion layer, and the fluorescence quantum yield can be increased.

A color conversion layer of this invention can be made to realize highly efficient color conversion characteristics without excessively increasing the film thickness, and moreover can be fabricated by simple manufacturing processes. Further, an organic EL element using such a color conversion layer can be made to realize high luminous efficiency, and moreover can be fabricated by simple manufacturing processes.

Further, a color conversion layer of this invention can be formed with high definition by a screen printing method or an inkjet method.

EXPLANATION OF REFERENCE NUMERALS

Figure 1:
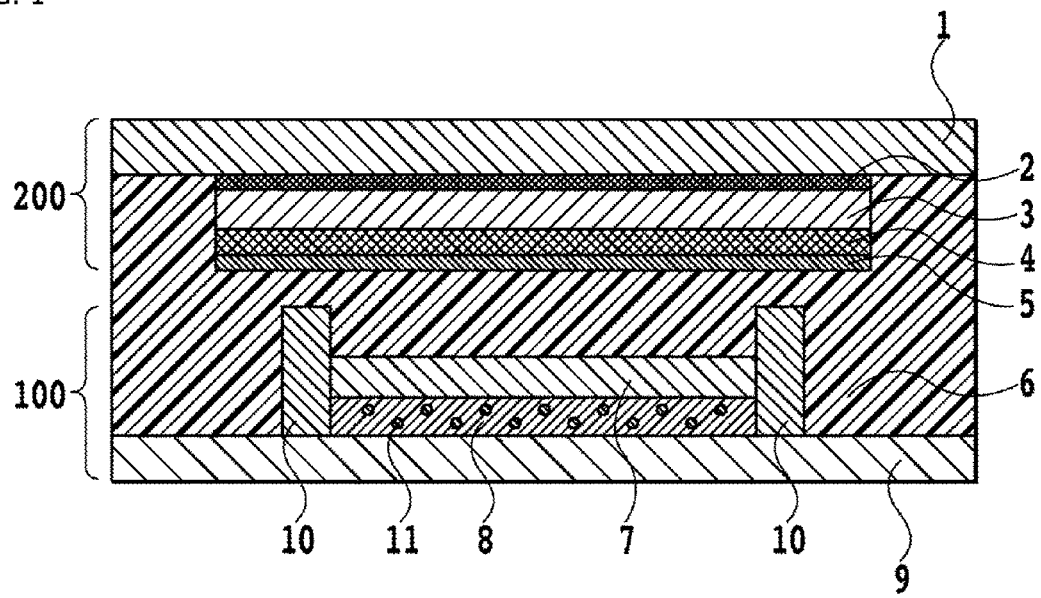
FIG. 1 is a cross-sectional view of an organic EL element using the color conversion layer 8 of one embodiment of this invention.

1 Second substrate
2 Electron injection electrode
3 Organic EL layer
4 Hole injection electrode
5 Protective film (passivation film)
6 Filler resin layer
7 Diffusion polymer material layer
8 Color conversion layer
9 Supporting substrate
10 Bank
11 Diffusion polymer material
18 Color conversion material layer
100 Color conversion substrate
200 Organic EL substrate

| EXPLANATION OF REFERENCE NUMERALS | |
|---|---|
| 1 | Second substrate |
| 2 | Electron injection electrode |
| 3 | Organic EL layer |
| 4 | Hole injection electrode |
| 5 | Protective film (passivation film) |
| 6 | Filler resin layer |
| 7 | Diffusion polymer material layer |
| 8 | Color conversion layer |
| 9 | Supporting substrate |
| 10 | Bank |
| 11 | Diffusion polymer material |
| 18 | Color conversion material layer |
| 100 | Color conversion substrate |
| 200 | Organic EL substrate |

BEST MODE FOR CARRYING OUT THE INVENTION

Below, a preferred embodiment of this invention is explained in detail, referring to the drawings. The embodiment described below is merely one example of this invention, and appropriate design modifications can be made by a person skilled in the art.

FIG. 1 is a cross-sectional view of an organic EL element using a color conversion layer manufactured by a manufacturing method of this invention. The organic EL element of FIG. 1 comprises a color conversion substrate 100, having, on a supporting substrate 9, banks 10, a color conversion layer 8 provided between the banks and including therewithin diffusion polymers 11, and a diffusion polymer material layer 7 provided on the color conversion layer 8; an organic EL substrate 200, having, provided on a second substrate 1, an electron injection electrode 2, an organic EL layer 3, a hole injection electrode 4, and a protective layer 5; and, a filler resin layer 6.

FIGS. 2A to 2D show processes for manufacturing a color conversion layer of an embodiment by a manufacturing method of this invention. Each process is explained below.

(Process of Fabricating the Color Conversion Material Layer)

Figure 2A:
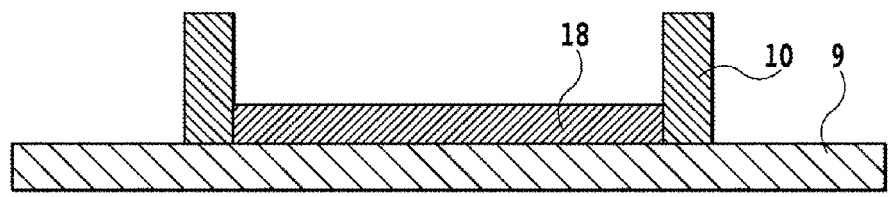
FIG. 2A shows a manufacturing process for the color conversion layer 8 of one embodiment of this invention.
Figure 2B:
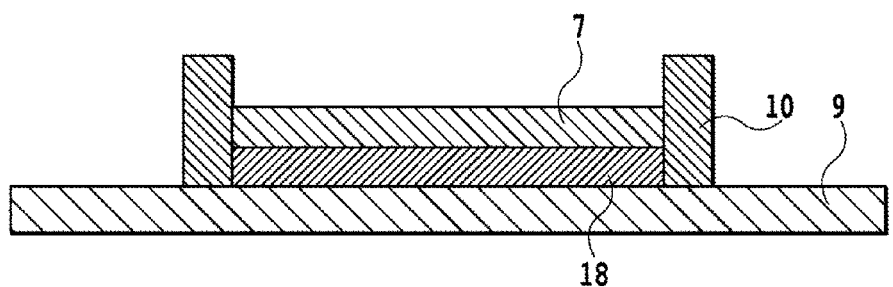
FIG. 2B shows a manufacturing process for the color conversion layer 8 of one embodiment of this invention.
Figure 2C:
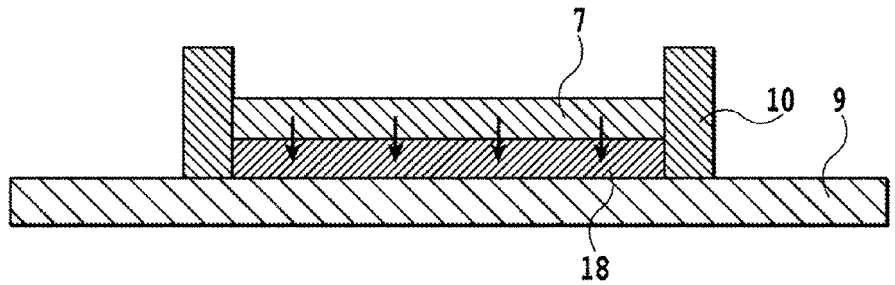
FIG. 2C shows a manufacturing process for the color conversion layer 8 of one embodiment of this invention.

First, a color conversion material layer 18 is fabricated on the supporting substrate 9 (FIG. 2A).

The supporting substrate 9 of this invention has excellent dimensional stability and is formed using materials which can withstand the conditions (solvents, temperatures, and similar) used in forming the color conversion layer 8. Specifically, the supporting substrate 9 can be formed using polyamide, polycarbonate, polyethylene terephthalate, polyethylene naphthalate, polybutylene terephthalate, poly-1,4-cyclohexane dimethylene terephthalate, polyethylene-1,2-diphenoxyethane-4,4'-dicarboxylate, polybutylene terephthalate, and other polyester resins, polystyrene, polyethylene, polypropylene, polymethyl pentene and other polyolefins, polymethyl methacrylate and other acrylic resins, polysulfone, polyethersulfone, polyetherketone, polyetherimide, polyoxyethylene, norbornene resin, and other polymer materials. In addition, optically transparent glass, silicon or other semiconductors, or optically opaque materials such as ceramics can also be used. A substrate may also be used which is provided with a color filter for adjustment of the emitted light color.

Banks 10 may be provided arbitrarily and selectively on the supporting substrate 9. Banks 10 are a layer which prevents spreading of ink to other than the necessary sites when an inkjet method, described below, is used to fabricate the color conversion material layer 18. When forming two or more types of color conversion layers 8 (color conversion material layers 18), banks 10 can prevent color mixing due to leakage of ink used to form color conversion material layers.

Banks 10 may be fabricated by using spin coating, dip coating, roll coating, gravure coating, a dispenser, or another wet coating method to form a prescribed thin film on the surface of the supporting substrate 9, and a photolithography method may further be used to form a pattern. As the material of the banks 10, a photohardening or photo/thermosetting resin can be used. Further, the banks 10 may be fabricated by using evaporation deposition, sputtering, or another dry process to deposit a film of LiF, $MgF_2$ or another solid, after which a photolithography method, dry etching, or another dry process is used to form a prescribed pattern.

The color conversion material layer 18 of this invention is formed using a polymer material having a color conversion function (polymer color conversion material). When forming the diffusion polymer material layer 7 on the color conversion material layer 18, in order to prevent elution into the applied polymer solution, it is preferable that the weight-average molecular weight Mw of the polymer color conversion material be 30,000 or higher and 500,000 or lower, and still more preferably 100,000 or higher and 300,000 or lower.

As the polymer color conversion material, phenylenevinylene system polymers, vinylene system polymers, fluorene system polymers, and other fluorescent materials or phosphorescent materials can be used. Specifically, poly[2-metoxy-5-(2-ethyl hexyloxy)-1,4-phenylenevinylene], poly[(9,9-dioctylfluorene-2,7-diyl)-co-(1,4-phenylenevinylene)], poly[(9,9-dioctyl-2,7-divinylenefluorene)-alt-co-{2-metoxy-5-(2-ethylhexyloxy)-1,4-phenylene}], and similar can be used.

From the standpoint of ease of manufacture and cost, the color conversion material layer 18 of this invention can be fabricated by executing a screen printing method, inkjet method, or other application process. To this end, it is desirable that the polymer color conversion material be soluble in a solvent.

The color conversion material layer 18 can be fabricated to an arbitrary film thickness. Fabrication can be to a film thickness that preferably is 10 nm or greater and 3000 nm or less, and still more preferably 50 nm or greater and 500 nm or less.

(Process of Fabricating the Diffusion Polymer Material Layer)

Next, a diffusion polymer material is employed to fabricate the diffusion polymer material layer 7 (FIG. 2B) on the color conversion material layer 18 formed as described above.

This diffusion polymer material layer 7 is fabricated for the purpose of causing the polymer material forming this layer to be diffused into the adjacent color conversion material layer 18. Hence in order to promote diffusion, it is desirable that the molecular weight of the diffusion polymer material forming this diffusion polymer material layer 7 not be very high. However, if the molecular weight of the diffusion polymer material is too low, when the diffusion polymer material is applied, there are cases in which the color conversion material layer 18 is dissolved. If the color conversion material layer 18 dissolves, the dissolved liquid leaks outside the pixels and gives rise to color mixing and similar.

As a result of diligent research, the inventors discovered that it is desirable that the diffusion polymer material layer 7 be formed from molecules having a weight-average molecular weight Mw of 500 or higher and 10,000 or lower. It is still more preferable that the diffusion polymer material layer 7 be formed from molecules having a weight-average molecular weight Mw of 1000 or higher and 3000 or lower.

As specific diffusion polymer materials of this invention, acrylic resins, methacrylic resins, epoxy modified acrylic resins, silicon modified acrylic resins, acrylic modified melamine resins, or similar can be used.

Further, it is preferable that the diffusion polymer material have an average optical transmissivity of 80% or higher in the wavelength region from 450 nm to 750 nm, and moreover that the fluctuation range of the optical transmissivity in the wavelength region from 450 nm to 750 nm be within ±5% of the average optical transmissivity. By this means, the diffusion polymer material layer 7 has adequate transparency for visible light in the wavelength region from 450 nm to 750 nm, so that light generated in the emission layer can pass through the diffusion polymer material layer 7 and be made incident on the color conversion layer 8 with good efficiency.

In the color conversion type organic EL element, it is necessary to optically join, in a satisfactory manner, the diffusion polymer material layer 7 and the color conversion layer 8 with the protective film 5 and/or filler resin layer 6 of the organic EL emission element, in order to cause efficient incidence on the color conversion layer 8 of blue light emitted by the organic EL layer 3. By adjusting the refractive index of the diffusion polymer material layer 7 to the refractive index of the adjacent color conversion layer 8, protective film 5 and/or filler resin layer 6, optical incidence losses can be suppressed and efficiency can be improved. In order to reduce losses in the quantity of incident light from the organic EL layer 3, it is desirable that the refractive index of the polymer material forming the diffusion polymer material layer 7, at an arbitrary wavelength in the visible light region of 450 nm to 750 nm, be 1.6 or higher, and moreover be the either the same as the refractive index of the color conversion layer 8 in contact, or be a value between the refractive indexes of the color conversion layer 8 and the filler resin layer 6.

In order to adjust the refractive index, a filler may be added to the diffusion polymer material layer 7. In particular, the refractive index of a diffusion polymer material layer 7 with a fine inorganic particle filler added can easily be raised compared with a diffusion polymer material layer 7 without an added filler. As a result, the light extraction efficiency can be improved more easily. For example, a filler added to the diffusion polymer material layer 7 may be nano-particle SiO (silicon oxide), SiON (silicon oxynitride), SiN (silicon nitride), or another inorganic high-refractivity material, or may be Ag, Ni (nickel), Al (aluminum), or another metal material. Even when a filler is added to the diffusion polymer material layer 7, it is preferable that the diffusion polymer material have an average optical transmissivity in the 450 nm to 750 nm wavelength region of 80% or higher, and moreover that the fluctuation range of the optical transmissivity in the wavelength region from 450 nm to 750 nm be within ±5% of the average optical transmissivity.

The above-described high-refractivity resin include OPSTAR-JN7102 manufactured by JSR Corp., a fine particle-disperse type acrylate system resin with a refractive index of 1.68; OGSOL EA-0200 manufactured by Osaka Gas Chemicals Co., Ltd., a fluorene derivative acrylate resin with a refractive index of 1.63; OPTOKLEB manufactured by Adell Corp., an acrylate system resin with a refractive index of 1.63; and OGSOL EG-210 manufactured by Osaka Gas Chemicals Co., Ltd., a fused type epoxy system resin with a refractive index of 1.62.

Fabrication of the diffusion polymer material layer 7 is possible by executing a screen printing method, inkjet method, or other application process. The diffusion polymer material layer 7, unlike the color conversion material layer 18, may be fabricated continuously across a plurality of pixels. Hence fabrication is also possible using a dispenser application method with lower positional precision, or using a spin coating method not accompanied by patterning.

The diffusion polymer material layer 7 can be fabricated to an arbitrary film thickness. Fabrication can be to a film thickness that preferably is 10 nm or greater and 5000 nm or less, and still more preferably 100 nm or greater and 2000 nm or less.

Further, a thermosetting resin may be used as the diffusion polymer material. Even when the molecular weight of the diffusion molecular material is comparatively low, by using heat after application to cause the formation of three-dimensional bridging, adequate mechanical strength can be imparted to the diffusion polymer material layer 7.

On the other hand, if bridging structures are formed between all the molecules forming the diffusion polymer material layer 7, the diffusion polymer material cannot diffuse into the color conversion material layer 18. Hence prior to the diffusion process described below, the hardening reaction conditions must be weakened, so that a state of partial three-dimensional bridging occurs. Specifically, in the case of a thermosetting resin, a measure such as lowering the heating temperature is necessary. As one example, when a thermosetting acrylic resin (hardening temperature 150° C.) is used, hardening may be performed for 1 to 2 hours in the range 80 to 100° C.

(Process of Diffusing the Diffusion Polymer Material)

Figure 2D:
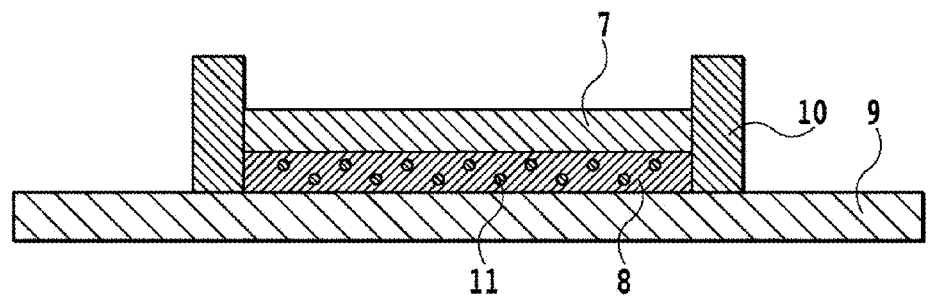
FIG. 2D shows a manufacturing process for the color conversion layer 8 of one embodiment of this invention.

Next, the diffusion polymer material of the diffusion polymer material layer 7 is diffused into the color conversion material layer 18 and converted (FIG. 2C), to fabricate a color conversion layer 8 including diffused polymers 11 (FIG. 2D). This process advances even if a layered member including the diffusion polymer material layer 7 and the color conversion material layer 18 are let stand at room temperature. Normally, after being let stand for 2 to 3 days at room temperature, the fluorescence quantum yield of the color conversion layer 8 rises by approximately 10 to 15%. While depending on the material, the value of the fluorescence quantum yield becomes constant after approximately 5 to 7 days. In many cases, an increase in the fluorescence quantum yield of approximately 20 to 25% from the initial state is observed.

In order to raise the diffusion efficiency, diffusion may be promoted by heating at 50° C. or higher and 200° C. or lower. When the diffusion polymer material is a thermosetting resin, heating is performed at or below the hardening temperature. It is preferable that heating be performed at a temperature which is 10° C. or more below the hardening temperature of the thermosetting resin.

Further, in order to prevent decomposition of the color conversion material due to adsorption of oxygen, it is preferable that the diffusion process be performed in an atmosphere of an inert gas and nitrogen.

When a thermosetting resin is used as the diffusion polymer material, after the diffusion process has ended, heating (not shown) can be used to cause adequate three-dimensional bridging of the diffusion polymer material, and mechanical strength can be imparted to the diffusion polymer material layer 7 and to the color conversion layer 8.

In the above example, a manufacturing method was explained in which the color conversion material layer 18 is first fabricated, and thereafter the diffusion polymer material layer 7 is fabricated. However, depending on the structure of the organic EL element, it is also possible to first fabricate the diffusion polymer material layer 7. In this case, first the diffusion polymer material layer 7 is fabricated on the supporting substrate 9, polymer color conversion material is applied thereupon, and a color conversion material layer 18 is fabricated. When the color conversion layer 8 is adjacent to the organic EL substrate 200, such a manufacturing method is preferable.

(Process of Fabricating the Organic EL Element)

The color conversion layer 8 obtained as described above is bonded with an organic EL substrate 200, fabricated separately and having a pair of electrodes (an electron injection electrode 2 and a hole injection electrode 4) and an organic EL layer 3, with a filler resin layer 6 interposed, to fabricate an organic EL element.

In this invention, the organic EL layer 3 includes an organic emission layer having at least one type of component which emits blue light at a wavelength shorter than 500 nm. Further, the organic EL layer 3 has a structure which includes, as necessary, a hole injection-transport layer and/or an electron injection-transport layer (for example (1) to (4) below, or similar).

(1) Hole injection electrode 4/organic emission layer/electron injection electrode 2

(2) Hole injection electrode 4/hole injection-transport layer/organic emission layer/electron injection electrode 2

(3) Hole injection electrode 4/organic emission layer/electron injection-transport layer/electron injection electrode 2

(4) Hole injection electrode 4/hole injection-transport layer/organic emission layer/electron injection-transport layer/electron injection electrode 2

Blue EL emission materials which can be used in the organic emission layer include oxazole metal complexes, distyrylbenzene derivatives, styrylamine-containing polycarbonates, oxadiazole derivatives, azo methine zinc complexes, and aluminum complexes that are disclosed in Japanese Patent Application Laid-open No. H7-142169, and doping with blue fluorescent dyes can be used as necessary (see Patent Reference 7). Further, materials disclosed in Japanese Patent Application Laid-open No. 2003-277743, Japanese Patent Application Laid-open No. 2003-277744 and Japanese Patent Application Laid-open No. 2003-306454 can also be used (see Patent References 8 to 10).

A hole injection-transport material which can be used in the organic EL layer 3 includes a compound which has capabilities for hole injection and transport, and moreover has excellent thin film formation capability.

Further, an electron injection-transport material which can be used in the organic EL layer 3 includes a compound which has excellent effect in injection electrons into the organic emission layer, the capacity to prevent movement of holes into the electron transport layer, and moreover excellent thin film formation capability.

The electron injection electrode 2 and hole injection electrode 4 can be formed using arbitrary materials and methods known in the art. In the organic EL element shown in FIG. 1, the hole injection electrode 4 is transparent in order to transmit light from the organic EL layer 3 to the diffusion polymer material layer 7 and color conversion layer 8. In this case, it is desirable that the electron injection electrode 2 be reflective, in order to improve the efficiency of light extraction.

As the material of the filler resin layer 6, a thermosetting or photosetting resin, or a photo/thermosetting resin, having adequate transparency for visible light in the 450 nm to 750 nm wavelength region, can be used. Specifically, as the material of the filler resin layer 6, from the standpoint of refractive index, the same material as is used in the diffusion polymer material layer 7 can be used.

EXAMPLES

Below, specific examples are used to explain this invention and the advantageous results thereof; however, the examples do not limit the scope of application of the invention.

Example 1

Fabrication of the Color Conversion Material Layer 18

A transparent positive type photoresist (OFPR-800 by Tokyo Ohka Kogyo Co., Ltd.) was applied onto a 50 mm×50 mm 1737 glass substrate manufactured by Corning Inc. Photolithography was used to fabricate columns of parallel banks, of width 20 μm, height 50 μm, and at a pitch of 60 μm, in a 20 mm×20 mm region in the center portion of the substrate.

Poly[(9,9-dioctylfluorene-2,7-diyl)-co-(1,4-phenylenevinylene)], which is a green color conversion material with a weight-average molecular weight of Mw=100,000 was dissolved in THF solvent, to prepare a green conversion material solution with concentration 1.5 wt %. The solution was applied within banks using an inkjet method in a nitrogen atmosphere. Thereafter, the substrate was dried by heating at 100° C. for 30 minutes, and a green color conversion material layer 18 was obtained. The film thickness was 0.8 μm.

(Fabrication of the Diffusion Polymer Material Layer 7)

Next, a dispenser is used to apply a thermosetting acrylic resin with a weight-average molecular weight Mw=1500 onto the color conversion material layer 18, and a diffusion polymer material layer 7 was fabricated with film thickness 1.0 μm. After applying the diffusion polymer material, the substrate was heated to 100° C. for 1 hour, and the diffusion polymer material was partially hardened.

(Diffusion of the Diffusion Polymer Material and Fabrication of the Color Conversion Layer 8)

Then, without exposing the substrate to the outside atmosphere, sealing was performed using a protective glass substrate for sealing. During sealing, a UV-hardening adhesive was applied to the peripheral portion of the substrate, and the protective glass substrate for sealing was bonded. After protecting the site at which the color conversion layer 8 was formed using a mask, the adhesive was hardened by irradiation with ultraviolet rays of wavelength 365 nm at 6 J/cm², and a sealed color conversion substrate 100 was fabricated.

Comparative Example 1

A color conversion substrate was fabricated by a procedure which was similar to the method of manufacture of a color conversion substrate 100 described in Example 1 above, except for not fabricating the diffusion polymer material layer 7. The film thickness of the color conversion layer was 0.8 μm.

Comparative Example 2

A color conversion substrate was fabricated by a procedure which was similar to the method of manufacture of a color conversion substrate 100 described in Example 1 above, except for the fact that the diffusion polymer material layer 7 was fabricated using a thermosetting acrylic resin with a weight-average molecular weight of Mw=12,000. The initial film thickness of the color conversion material layer 18 was 0.8 μm, and the initial film thickness of the diffusion polymer material layer 7 was 1.0 μm.

Comparative Example 3

A color conversion substrate was fabricated by a procedure which was similar to the method of manufacture of a color conversion substrate 100 described in Example 1 above, except that instead of fabricating the color conversion material layer 18 and the diffusion polymer material layer 7, a color conversion material solution to which a thermosetting acrylic resin had been added was used to fabricate the color conversion layer 8.

In greater detail, poly[(9,9-dioctylfluorene-2,7-diyl)-co-(1,4-phenylenevinylene)] was dissolved in THF solvent, and a thermosetting acrylic resin with a weight-average molecular weight of Mw=1500 was added. A plurality of different types of solutions with different fractions of acrylic resin added were prepared. The solutions with all compositions were rotation-stirred over 24 hours so as to uniformly disperse the acrylic resin.

The solutions prepared in this way were applied onto glass substrates 9 on which banks had been formed and were dried by heating at 100° C. for 30 minutes, similarly to Example 1. Thereafter, similarly to Example 1, protective glass substrates for sealing were used to seal the color conversion substrates.

Evaluation 1

The samples fabricated in Example 1 and in Comparative Examples 1 to 3 were subjected to measurements of the fluorescence quantum yield of the respective color conversion substrates using an integrating sphere. The excitation light wavelength when measuring the fluorescence quantum yield was 470 nm. For all the samples, diffusion was performed by letting samples stand at room temperature, without promoting polymer diffusion by heating.

The fluorescence quantum yield was measured at each preset time, and changes in the fluorescence quantum yield for each sample were investigated. Table 1 shows the relation between the fluorescence quantum yield (%) and the time elapsed from fabrication of the diffusion layer for the color conversion substrates fabricated in Example 1 and in Comparative Examples 1 and 2.

TABLE 1

| Elapsed time (h) | 2 | 15 | 50 | 170 | 300 |
| --- | --- | --- | --- | --- | --- |
| Example 1 | 56.4 | 63.2 | 69.6 | 74.7 | 77.7 |
| Comparative Example 1 | 34.6 | 34.6 | 34.6 | 34.6 | 34.6 |
| Comparative Example 2 | 28.8 | 31.1 | 32 | 32.2 | 33.7 |

In Example 1, at two hours after fabrication the fluorescence quantum yield was already approximately 20% higher than for Comparative Example 1, which did not have a diffusion polymer material layer 7. After 50 hours, the fluorescence quantum yield in Example 1 reached approximately 70%.

On the other hand, in Comparative Example 1 there was no change in the fluorescence quantum yield even after 300 hours had passed. Further, in Comparative Example 2 the fluorescence quantum yield increased gradually, but the extent of increase was extremely slight. While this consideration is not limited by theory, it is thought that because a polymer material with a high molecular weight was used in Comparative Example 2, the diffusion rate of the diffusion polymer material was low, and so less of the diffusion polymer material 11 intruded into the color conversion material layer 18. Consequently it is thought that in Comparative Example 2, molecular interaction between color conversion materials was not greatly reduced, and so the effect in increasing the fluorescence quantum yield was also small.

Table 2 shows the relation between the fluorescence quantum yield (%) of the color conversion layers fabricated in Comparative Example 3 and the mixing proportion (weight ratio) of acrylic resin.

TABLE 2

| Color conversion material:acrylic resin | 1:0 | 1:3 | 1:10 | 1:40 |
|---|---|---|---|---|
| Fluorescence quantum yield (%) | 29.8 | 30.8 | 31.5 | 57.6 |

As described above, even when the proportion of added acrylic resin reaches 10 times the quantity of color conversion material, no increase in fluorescence quantum yield occurred. When the acrylic resin quantity was 40 times that of the color conversion material, an increase in fluorescence quantum yield was observed.

In this way, the method of mixing a diffusion polymer material with a color conversion material in a solution state and then fabricating the color conversion layer has extremely little effect. Further, it is seen that even when there is an effect, a large quantity of polymer material is added, so that in order to obtain adequate absorbance, the film thickness must be increased.

While this consideration is not limited by theory, in a method of this invention the diffusion polymer material 11 intrudes into the color conversion material layer 18 at the molecular level, and so it is assumed that there is an effect of widening the intervals between the color conversion material molecules forming the color conversion material layer 18. On the other hand, when a film is formed from a solution of a mixture of the color conversion material and the diffusion polymer material, it is expected that the color conversion material and the diffusion polymer material each assume phase-separated structures. Consequently, compared with a method of this invention, it is thought that the intermolecular interaction of the color conversion materials cannot be adequately reduced.

Evaluation 2

In order to verify that the polymer material is diffused within the color conversion layer 8, a focused ion beam (FIB) microscope was used to analyze the cross-sections of samples fabricated in Example 1 and in Comparative Examples 1 and 2. Also, fluorescence spectra of each of the color conversion substrates were measured.

Figure 3:
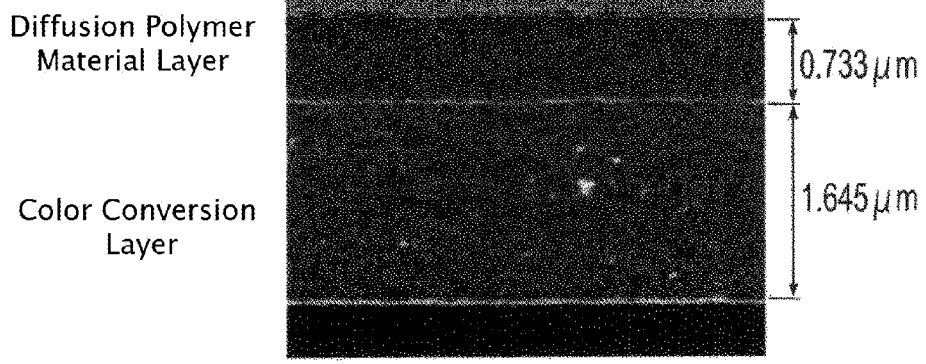
FIG. 3 is a cross-sectional view of the color conversion substrate fabricated in Example 1.
Figure 4:
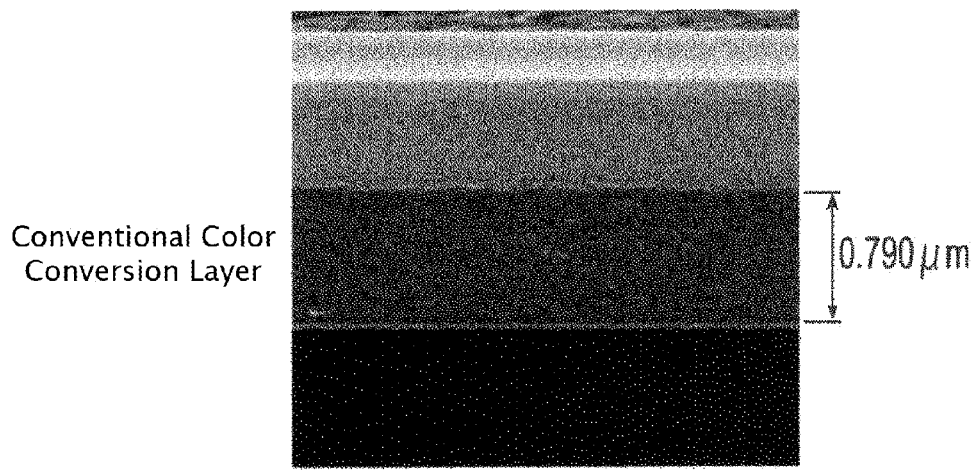
FIG. 4 is a cross-sectional view of the color conversion substrate fabricated in Comparative Example 1.
Figure 5:
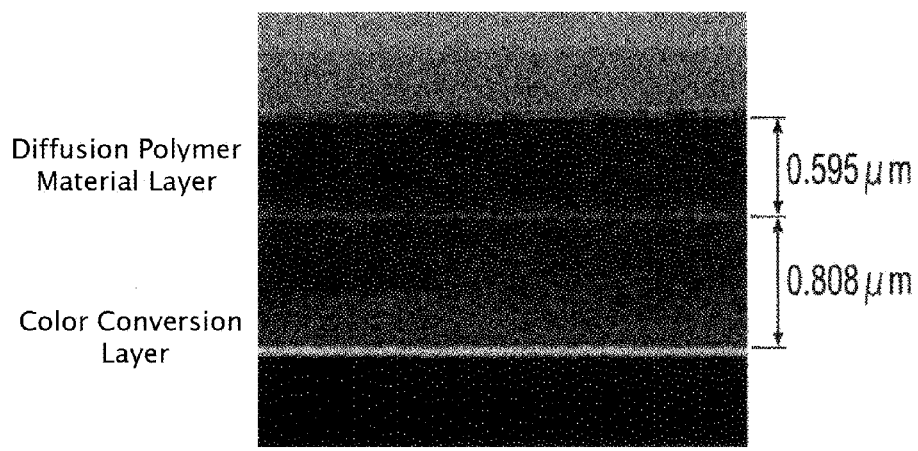
FIG. 5 is a cross-sectional view of the color conversion substrate fabricated in Comparative Example 1.

FIGS. 3 to 5 are photos taken by FIB of the cross-sections of color conversion substrates fabricated in Example 1 and in Comparative Examples 1 and 2 (FIGS. 3 to 5).

The film thickness of the color conversion layer 8 for Example 1 was approximately twice the initial film thickness shown for Comparative Example 1. This is thought to be because diffusion polymer material was diffused from the diffusion polymer material layer 7 to the color conversion material layer 18, and consequently the color conversion material layer 18 swelled. That is, in Example 1, the content of diffusion polymer material 11 in the color conversion layer 8 was approximately 50%.

On the other hand, the film thickness of the color conversion film in Comparative Example 2 hardly increased at all. This is thought to be because in Comparative Example 2 there was hardly any occurrence of diffusion of polymer material.

Figure 6:
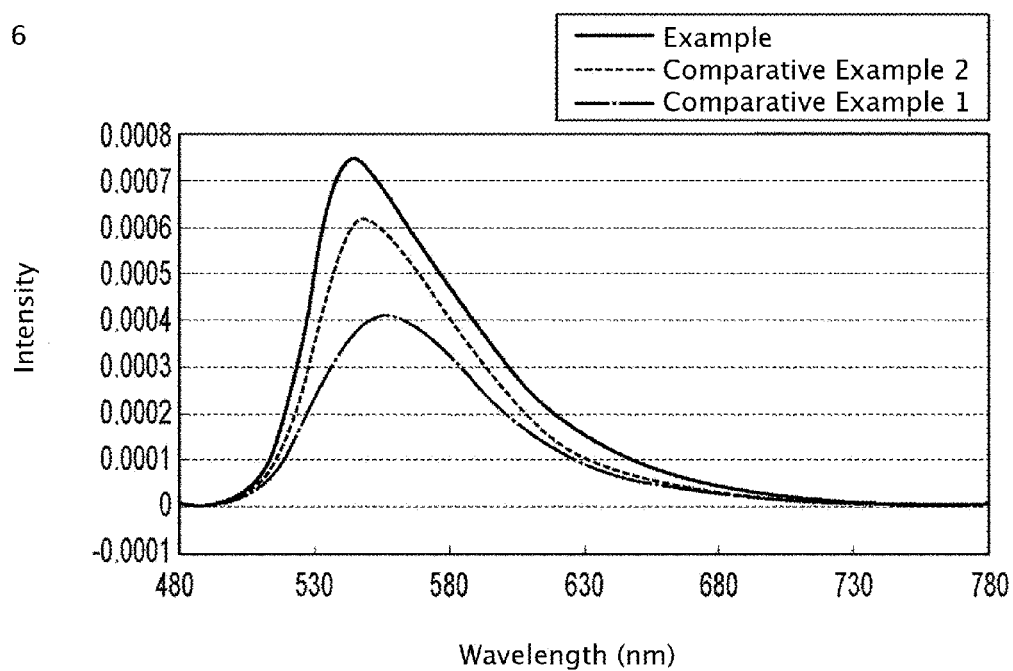
FIG. 6 shows the fluorescence spectra of the color conversion substrates fabricated in Example 1 and in Comparative Example 1 and Comparative Example 2.

FIG. 6 shows the fluorescence spectra of color conversion substrates fabricated in Example 1 and in Comparative Examples 1 and 2.

Taking as reference the wavelength in Comparative Example 1, the emission peak wavelength was shorter in both Comparative Example 2 and in Example 1. The wavelength shift is greater for Example 1 than for Comparative Example 2.

Because the short-wavelength shift of the emission peak wavelength is thought to reflect a reduction in the interaction between color conversion materials, the larger the shift, the greater the reduction in intermolecular interaction is judged to be. Hence it is thought that the interaction between color conversion materials is reduced the most in Example 1, with the greatest shift, and that the reduction in interaction between color conversion materials is smaller in Comparative Example 2 than in Example 1.

The invention claimed is:

1. A manufacturing method for a color conversion layer, comprising:
   a step (1) of employing a polymer color conversion material, and fabricating a color conversion material layer on a substrate;
   a step (2) of employing a diffusion polymer material, and fabricating a diffusion polymer material layer on the color conversion film material layer; and
   a step (3) of diffusing the diffusion polymer material from the diffusion polymer material layer into the color conversion material layer, and fabricating a color conversion layer,
   wherein the polymer color conversion material has a weight-average molecular weight of 30,000 or higher and 500,000 or lower, and
   the diffusion polymer material has a weight-average molecular weight of 500 or higher and 10,000 or lower.

2. The manufacturing method according to claim 1, characterized in that step (1) is executed by applying the polymer color conversion material.

3. The manufacturing method according to claim 1, characterized in that step (2) is executed by applying the diffusion polymer material.

4. The manufacturing method according to claim 1, characterized in that step (3) is promoted by heating.

5. The manufacturing method according to claim 1, characterized in that the diffusion polymer material is selected from the group consisting of acrylic resins, methacrylic resins, epoxy modified acrylic resins, silicon modified acrylic resins, and acrylic modified melamine resins.

6. The manufacturing method according to claim 1, characterized in that the diffusion polymer material includes a thermosetting resin.

7. The manufacturing method according to claim 6, further comprising, following step (3), a step (4) of hardening the diffusion polymer material.

8. A color conversion layer, manufactured by the method according to any one of claims 1 to 7.

9. An organic EL element, comprising the color conversion layer according to claim 8, a pair of electrodes, and an organic EL layer.

* * * * *